United States Patent [19]

Lee et al.

[11] Patent Number: 4,535,291
[45] Date of Patent: Aug. 13, 1985

[54] METHOD FOR SUPERCONDUCTING MAGNET SHIMMING

[75] Inventors: Reuy-Lin Lee, Fremont; George D. Kneip, Jr., Menlo Park; Marvin H. Anderson, Mountain View, all of Calif.

[73] Assignee: Varian Associates, Inc., Palo Alto, Calif.

[21] Appl. No.: 406,418

[22] Filed: Aug. 9, 1982

[51] Int. Cl.$^3$ .............................................. G01R 33/08
[52] U.S. Cl. ..................................... 324/320; 335/216
[58] Field of Search ............... 324/318, 319, 320, 313; 361/141; 335/216; 323/221, 229, 233, 360

[56] References Cited

U.S. PATENT DOCUMENTS

| | | |
|---|---|---|
| 2,589,494 | 3/1952 | Hershberger ........................ 324/313 |
| 3,412,320 | 11/1968 | Marshall .............................. 335/216 |
| 4,164,777 | 8/1979 | Kneip, Jr. et al. ................... 361/331 |
| 4,173,775 | 11/1979 | Kneip, Jr. ............................. 324/320 |

FOREIGN PATENT DOCUMENTS 1091640  11/1967  United Kingdom ................ 324/313

Primary Examiner—Ernest F. Karlsen
Assistant Examiner—Kevin D. O'Shea
Attorney, Agent, or Firm—Stanley Z. Cole; Edward H. Berkowitz

[57] ABSTRACT

Component coils for providing a desired magnetic field distribution, which coils are subject to interaction via mutual inductance thereof, are connected each to respective current regulated power supplies whereby the interaction is compensated. Circuits are provided to control selected pluralities of interacting coils via persistence switches with minimum number of control leads in order to reduce the thermal communication to the interior of a cryostat housing the magnet and persistence switches.

5 Claims, 6 Drawing Figures

METHOD FOR SUPERCONDUCTING MAGNET SHIMMING

FIELD OF THE INVENTION

The present invention is in the field of superconducting magnet apparatus and relates particularly to the control of magnetic field homogeniety for magnetic resonance measurements.

BACKGROUND OF THE INVENTION

The specification of regions of magnetic field homogeniety has been a limiting aspect for the achievable precision of high resolution magnetic resonance phenomena. For analytic nuclear magnetic resonance spectrometers departures from homogeniety are typically less than one part in $3 \times 10^{-9}$ over a volume of the order of 1 cm. For the purposes of NMR imaging apparatus one wishes to produce magnetic field gradients which are precise and reproducible over volumes substantially similar to that of the human body. Both of these applications require control of magnetic field gradients.

Control of aberrant gradients (shimming) is ordinarily accomplished by addition of an equal magnitude gradient of opposite sign or direction to cancel the aberration. Gradients in several different directions necessitate corresponding corrections and high quality magnet systems are characterized by a number of shimming coils to correct undesired spatial dependences of the magnetic field and in modern NMR imaging systems, to establish desired spatial dependence. External to the magnet structure the dependences which commonly appear may be considered as concomitants of the multipole expansion of the magnetic field. Therefore, when a zero-gradient spatial dependence of the magnetic field is desired over a microscopic volume element, the spherical harmonic functions are to be synthesized by a system of shimming coils acting to cancel the high order multipole terms defining the magnetic multipole field of the main field coil. This synthesis is accomplished with a plurality of shimming coils which ideally exhibit pure multipole components.

In a common geometry, the field in the interior of the solenoid on or near the axis is the volume of interest for which the field distribution is to be controlled. The field may be resolved into radial and axial components for a field point at coordinates $\rho(\alpha_1 = \text{radius})$ and $\theta$ within a sphere centered on axis at the symmetry midplane and wholly within the magnet interior as $$H_r(\rho,\theta) = H_o\left[ + E_2\left(\frac{\rho}{a_1}\right)^2 P_2'(\cos\theta) + E_4\left(\frac{\rho}{a_1}\right)^4 P_4'(\cos\theta) + \ldots \right]$$

$$H_z(\rho,\theta) = H_o\left[ 1 + E_2\left(\frac{\rho}{a_1}\right)^2 P_2(\cos\theta) + E_4\left(\frac{\rho}{a_1}\right)^4 + \ldots \right]$$

Where the quantities $P_n(\cos\theta)$ are Legendre polynomials of order n and the coefficients $E_n$ are Taylor series coefficients, as for example $$E_{2m} = \frac{1}{H_o} \frac{1}{(2m)!} \left.\frac{d^{2m}H_z(z,\theta)}{dz^{2m}}\right|_{z=0}$$

For the special case of the axial field along the Z axis and the central plane respectively the above expressions reduce to $$H_z\left(r,\frac{\pi}{2}\right) = H_o\left[ 1 - \frac{1}{2}E_2\left(\frac{r}{a_1}\right)^2 + \frac{3}{8}E_4\left(\frac{r}{a_1}\right)^4 - \frac{5}{16}E_6\left(\frac{r}{a_1}\right)^6 + \ldots \right]$$

$$H_z(z,0) = H_o\left[ 1 + E_2\left(\frac{z}{a_1}\right)^2 + E_4\left(\frac{z}{a_1}\right)^4 + \ldots \right]$$

The details of solenoid design are outside the scope of the present work. Relevant discussion may be found in Montgomery, Solenoid Magnet Design, Wiley Interscience, 1969.

Further departures from the desired spatial dependence follow from the construction of particular components. For example, the main field is obtained from a solenoid and additional axial and transverse components are usually present due to the construction of the solenoid. An example of the reduction of certain such gradients through construction details is given in U.S. Pat. No. 4,213,092.

In the case of an NMR spectrometer, the field in the interior of the solenoid is unidirectional of constant magnitude, but for small axial and radial gradients which it is desired to remove. The prior art construction of such solenoids and gradient removal is documented in U.S. Pat. Nos. 3,287,630; 3,419,904; 3,564,398; 3,577,067 and 4,180,769.

It is well known to workers in the field of NMR that the requisite shimming of the NMR magnetic field is often a tedious process due to the interaction of particular pairs of shim coils through the mutual inductance of such pairs of coils. An iterative procedure is generally required to arrive at the desired tolerance for the field dependence. In the case of persistent mode superconducting magnet systems, including superconducting shims, the operation is the more tedious for the requisite steps in altering the various persistent currents.

Superconducting magnet systems offer a further constraint due to the desired thermal isolation between the magnet in the interior of a cryostat and its external controlling apparatus.

In the prior art, it was recognized that selective excitation of the several independent components of a persistent mode magnet would offer an unusual improvement in reduction of thermal loss by minimizing the number of conductors required for communication between the interior and exterior of the magnet cryostat. Several embodiments directed to this end are discussed and claimed in U.S. Pat. No. 4,173,775, commonly assigned with the present work.

Earlier prior art provided leads sufficient to independently excite the several shim components independently. While this permits an iterative process of great flexibility, the number of conductors leading from the interior of the cryostat to ambient temperature undesirably reduces the thermal isolation between interior and exterior of the cryostat, thereby increasing the rate at which the cryogen is consumed by boiling.

It has also been found that the selective persistence switching function set out in U.S. Pat. No. 4,164,777 may be accomplished with a diode-based device where the heat evolved by the diode (forward bias) is sufficient to affect the transition of a portion of superconductor to its normal state. Although this prior art was inherently capable of exciting more than one persistence switch concurrently, no current limiting was provided in the individual switches. As a consequence, any selected switch could heat more than necessary for the switching function resulting in unnecessary dissipation of the cryogen.

SUMMARY OF THE INVENTION

It is an object of the present invention to minimize the complications introduced by mutual inductance interactions between superconducting shim coils of a superconducting magnet system.

It is another object to provide a thermally efficient control means to selectively excite pairs of persistent mode superconducting magnet windings.

It is still another object to limit the heat evolved in persistence switches in order to avoid unnecessary consumption of cryogen.

The above goals are realized in a magnet system wherein interacting pairs of magnet windings are excited concurrently. Thus, the mutual inductance term is given by $$M_{12}\left(\frac{dI_1}{dt}\right)^2\left(\frac{dI_2}{dt}\right)^2$$

for the interacting pair. This is effectuated in a superconducting system by arranging the circuit components in arrays of diodes for energizing persistence switches in particular specified pairs. Power for energizing the coils controlled by these persistence switches is supplied by two separate current regulated power supplies 1 and 2, which provide the correlation $$\frac{dI_1}{dt} = -\frac{dI_2}{dt}$$

through their current regulating properties. Thus, where a desired pair of coils is selected by addressing a diode array in accordance with this aspect of the invention, the field currents to the respective magnet windings are separately supplied in a relative manner such that an additional load (or sink) as seen by one supply represents an additional source as to the other supply. The current regulatory feature compensates the respective circuits.

DETAILED DESCRIPTION OF THE INVENTION

Figure 1:
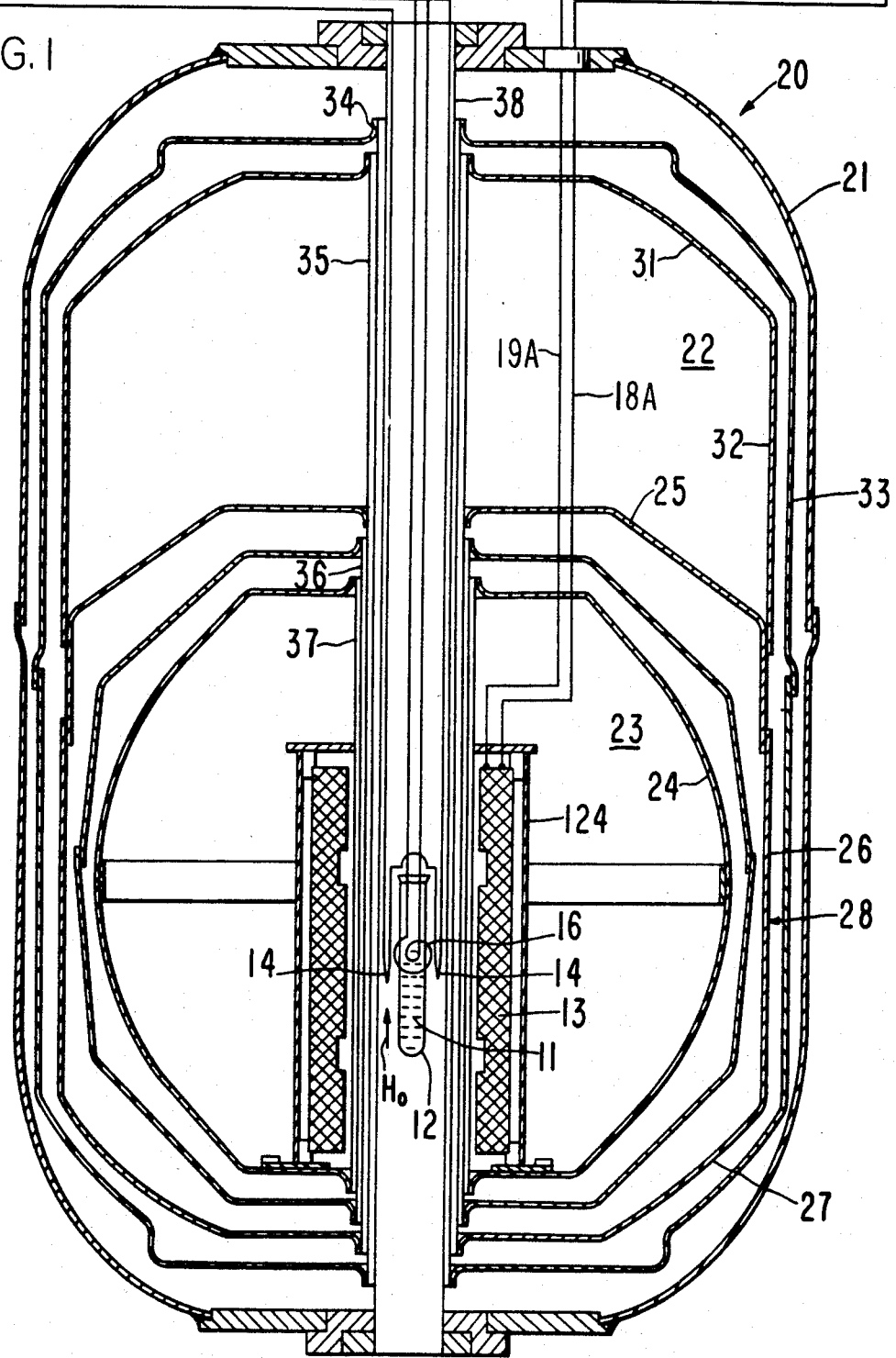
FIG. 1 is a cross-sectional view of an NMR spectrometer including superconducting magnet system of the present invention.

Referring now to FIG. 1 of the drawings wherein there is described a nuclear magnetic resonance spectrometer which employs a superconducting magnet system. The sample 11 is disposed within vial 12 for analysis of its magnetic resonance characteristics and is therefore located within a homogeneous magnetic field $H_0$ produced in the interior axial space of superconducting solenoid 13. In a typical spectrometer, a pair of transmitter coils 14 are disposed on vial 12 within the interior axial space of solonoid 13 with the axes of coils 14 in mutual alignment and transverse to the field of $H_0$. The transmitter coils 14 are responsive to RF energy derived from RF transmitter 15 to irradiate the sample. The receiver coil(s) 16 is disposed with axes transverse to both the axes of coils 14 and field $H_0$ in proximity to sample 11 to derive from sample 11 the resonant properties thereof. An RF receiver 17 communicating with receiver coil 16 amplifies and detects the resonant signal.

The superconducting magnet 13 is energized by DC power supply apparatus 18 communicating therewith through symbolic leads 18A that extend through a relatively narrow sleeve in Dewar 12; the leads 18A are schematically shown as extending to the Dewar and are connected to energize solenoid 13 in any of its associated windings. In response thereto, a relatively high intensity homogeneous magnetic field $H_0$ extends through the volume of sample 11. Field intensities on the order of $10^2$ kilogauss are commonly employed. When the field of superconducting magnet system 13 is deemed satisfactory, it may be disconnected from the power supply and a magnetic field is maintained by a persistent circulating current due to the superconducting properties of the magnet windings. The control of persistence switches is symbolically indicated by coil selection apparatus 19 communicating with further components in the interior of the cryostat through leads 19A.

To achieve the resonant spectral distribution of the properties of sample 11, transmitter 15 supplies precisely defined pulses of RF energy to coil 14 and these pulses having a wide frequency component distribution are selectively absorbed by the sample. Receiver coil 16 picks up the energy re-radiated from sample 11 and receiver 17 following RF processing and digitization of the time dependent signal performs Fourier transformation calculations resulting in an NMR spectral distribution for display or recordation in device 210.

The superconducting magnet system 13 is maintained at cryogenic temperatures characteristic of the superconducting phase of magnet components. In a preferred embodiment, this cryogenic temperature is established with a Dewar 20 having an exterior aluminum shell 21 and a reservoir 22 that holds liquid nitrogen at approximately 77° K. Below liquid nitrogen reservoir 22 is a further reservoir 23, filled with liquid helium. Reservoir 23 surrounds cylinder 124 in which the superconducting magnet system 13 is located. Evacuated space, maintained at a typical vacuum of about $10^{-5}$ Torr, exists between wall 24 of reservoir 23 and floor 25 of reservoir 22 as well as between wall 24 and sidewall 26 and floor 27 of thermal radiation shield 28. In the evacuated space immediately outside of reservoir 23 is a further thermal radiation shield 29. A further evacuated space exists between the top 31 and sidewall 32 of reservoir 22, as well as between wall 26 and floor 27 of radiation shield 28, and shell 21. In this further evacuated space, there is located another radiation shield 33. To assist in minimizing the flow of heat from the exterior of Dewar 20 to the superconducting magnet system 13, shield 33, top 31, floor 25 and shield 29 are respectively provided with sleeve 34, 35 and 36, all of which are concentric with bore 37 that extends through the interior of reservoir 23. Bore 37 is coaxial with sleeve 38 and extends between diametric ends of Dewar 20. The superconducting magnet system is coaxial with sleeves 34-36 so that the magnetic field $H_0$ also extends in the same direction as the common longitudinal axes of the sleeves. Construction of the Dewar of the present system is detailed in U.S. Pat. Nos. 4,212,169; 4,291,541 and U.S. Ser. No. 879,290, abandoned; the main structure of superconducting magnet system is described in U.S. Pat. No. 4,180,769.

Figure 2:
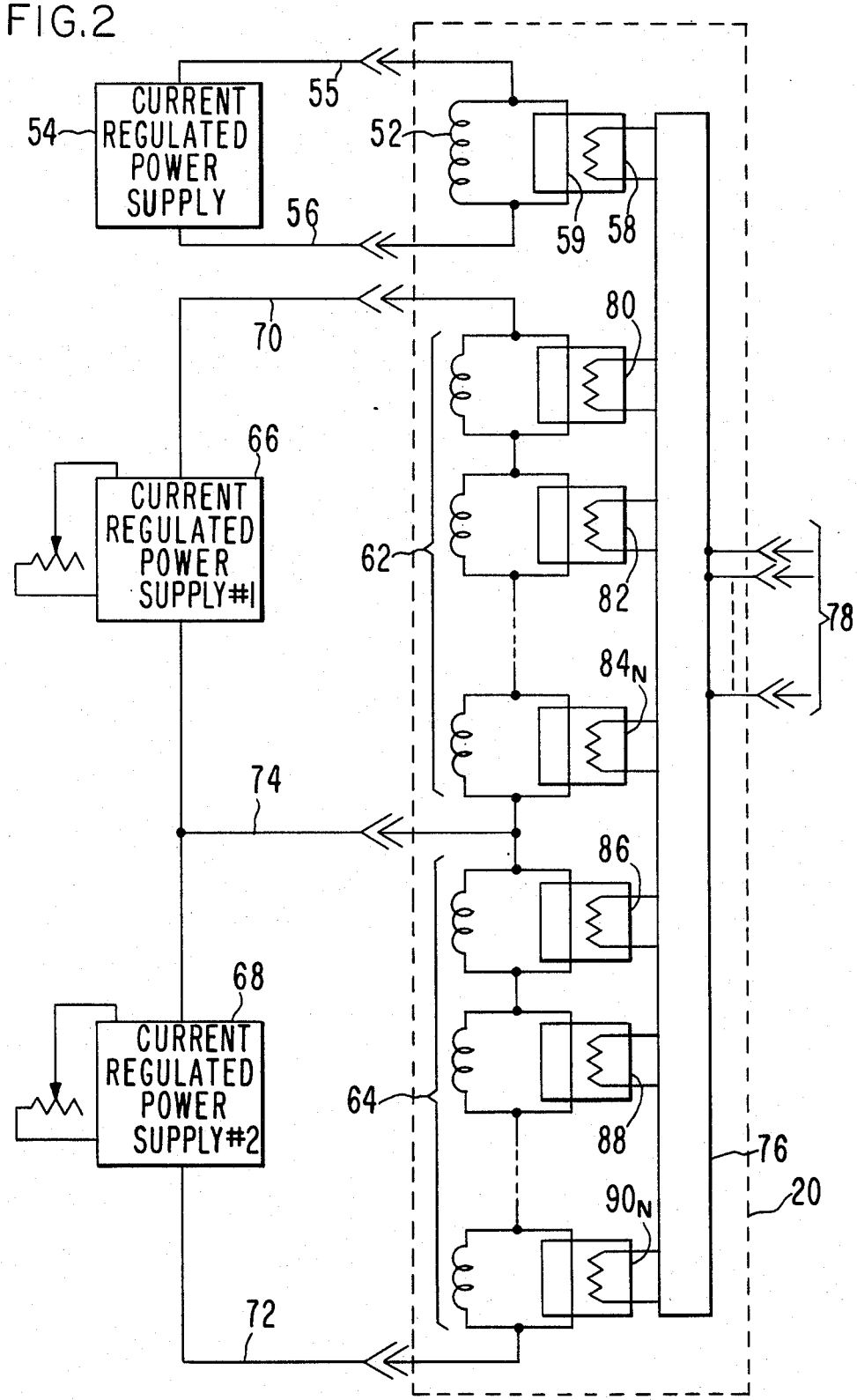
FIG. 2 illustrates simultaneous adjustment of current in certain pairs of shim coils according to the invention.

Turning now to FIG. 2, the dotted enclosure represents the Dewar 20. A main solenoid 52 is supplied by current regulated power supply 54 through leads 55 and 56. A persistence switch 58 controlled in a manner discussed below selects normal or superconducting phase for a portion of the main solenoid shunt conductor 59. When the shunt 59 is superconducting, main power supply 54 may be disconnected and the magnetic field of the solenoid is maintained in the persistent mode by circulating currents in the superconducting group comprising solenoids 52 and shunt 59.

The shim coils for gradient correction are organized in two groups 62 and 64, each group independently energized by separate corresponding current regulated power supplies 66 and 68 through respectively leads 70 and 72 and through lead 74 common to the two groups.

It is here noted that one lead can be saved (and thermal dissipation in the cryostat thereby reduced) where leads 56 and 70 are in fact the same conductor.

The several gradient correcting coils are designed to produce fields which correspond to terms in the expressions for $H_Z$ and Hr. Certain combinations of transverse gradients are also provided.

The mutual inductance coupling between certain gradient correcting coils is most pronounced for axial gradients of adjacent even orders, e.g., $H_0$, $H_2$ and $H_4$. Odd order gradients are cancelled by paired shimming coils of opposite helicity and the mutual inductance therebetween is limited principally by close geometrical tolerances; consequently, the coupling between odd order gradient coils is usually an order of magnitude smaller in comparison with next lower order even gradients. It is desired that the shunts of individual correction coils of groups 62 be paired with shunts of certain correction coils in groups 64 in the relationships that the members of either group are strongly coupled by their mutual inductances during non-persistent operations to avoid iterative adjustment sequences between the selected pairs of coils. Such pairs are interactive via their mutual inductances and each communicates with respective current regulated power supply 66 and 68. Consequently, an inductive component in one circuit which appears as a load to one such power supply is absorbed in the interacting circuit by the other power supply operating as a current sink. In like manner, the main solenoid may be simultaneously operated to function as source or sink for correction coils strongly coupled thereto.

The correlation of selected coils is accomplished in decoding array 76. From a plurality of end conductors leading to the exterior of the cryostat 50, it is desired to excite any of $N_1$ switches of group 62 and $N_2$ switches of group 64, and/or pairs of switches one from each group and/or triplets of switches by inclusion of the main coil.

In a specific example pairs of non-interacting coils are grouped together for excitation from a common power supply. When simultaneously excited from the respective power supplies the mutual inductance interaction is automatically compensated. The main solenoid $H_O$ is excited from a separate current regulated power supply and can be associated with selected ones of the shim coils within the capacity of the switch selection network described below. For example, $H_0$ may be excited concurrently with $H_2$ and $H_4$ as well as individually excited by the current regulated supply 54. Table I is an example of the grouping.

TABLE I

| Group 62 | Group 64 |
| --- | --- |
| $H_2$ | $H_4$ |
| $H_1$ | $H_3$ |
| $H_X$ | $H_Y$ |
| $H_{XZ}$ | $H_{YZ}$ |
| $H_{XY}$ | $H_{X^2-Y^2}$ |

Figure 3:
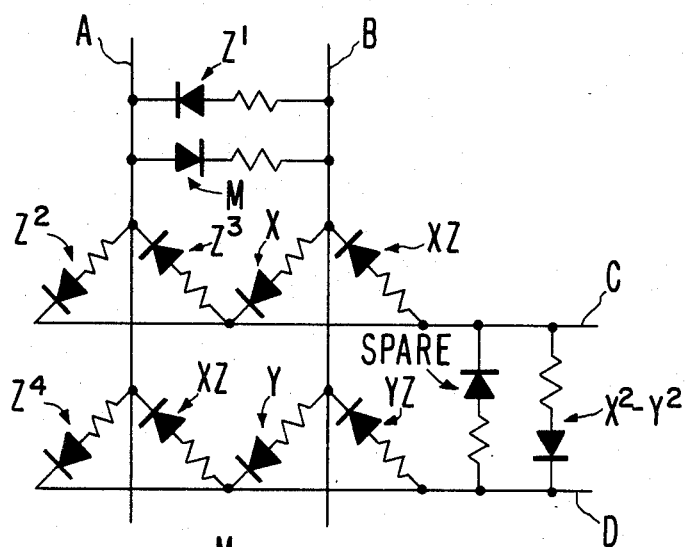
FIG. 3 shows a diode matrix for selectable excitation of any one persistent switch or certain pairs of switches.

The decoding array 76 may take several forms; one simple generic approach is a binary to octal or hexadecimal decoder. A more particular decoding array is shown in FIG. 3 and further analyzed in Table II. This is a four input lead device which can serve 12 individual functions between pairs of the four input leads.

TABLE II

| − \ + | A | B | C | D |
| --- | --- | --- | --- | --- |
| A | — | MAIN | $Z^2$ | $Z^4$ |
| B | Z | — | X | YZ |
| C | $Z^3$ | ZY | — | Spare |
| D | XZ | Y | $X^2-Y^2$ | — |

The switch selection of the present invention may be implemented with means such as described above by assuring that the simultaneous selection of switches does not result in excess heat dissipation. This is accomplished by adding resistance in series with each switch diode to limit the current through that switch. For a typical diode for which the forward voltage drop is in the range 0.735–0.84 volts excited at 1.1 volts and limited to 100 ma (maximum $E_f$), the required additional resistance is 2.9 ohms. Maximum current corresponding to the lower end of the range of $E_f$ is 136 ma.

When terminal A is connected to a DC excitation potential and switches B, C and D connected to ground to establish a first plurality of concurrently excited switches, the current flow is through the $Z^2$ diode to terminal C and through $Z^4$ diode to terminal D and through M (for MAIN) diode to terminal B. If on the other hand, terminal A is connected to ground while terminals B, C and D are connected to the higher excitation potential than switches $Z^1$, $Z^3$ and XZ switches will be selected. Excitation of a persistent switch transfers heat to a superconductor segment sufficient to cause a transition from superconducting to normal phase. Therefore, to turn on a persistence switch is to return the corresponding circuit comprising superconducting coil and shunt to the normal state. In the present invention, this operation is performed pair-wise to permit a pair of coils to be adjusted concurrently without requiring iterative compensation for mutual inductive interactions and to minimize the number of thermal conductors required to the interior of the cryostat.

Figure 4:
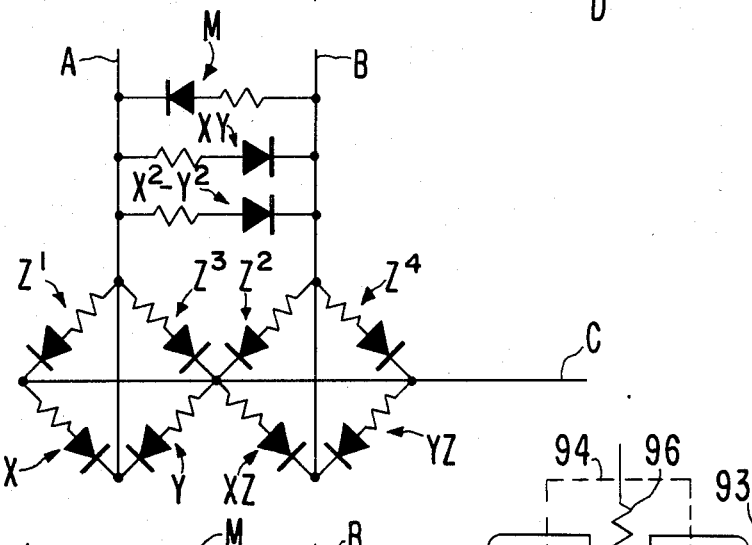
FIG. 4 shows another diode matrix for selectable excitation of a given persistent switch or certain pairs of switches.

In like manner, the three lead system of FIG. 4 (analyzed in Table III) reduces the thermal losses to the interior of the cryostat by further reducing the member of conductors while providing selection of six separate functions between pairs of input leads. These functions may include multiple switch excitation through the artifice of placing persistent switches for desired combinations in parallel.

TABLE III

| − | + | A | B | C |
|---|---|---|---|---|
| A | — |   | XY<br>$X^2-Y^2$ | $Z^1,Z^3$ |
| B | M | — |   | $Z^4,Z^2$ |
| C | X,Y | XZ<br>YZ | — |   |

Figure 5:
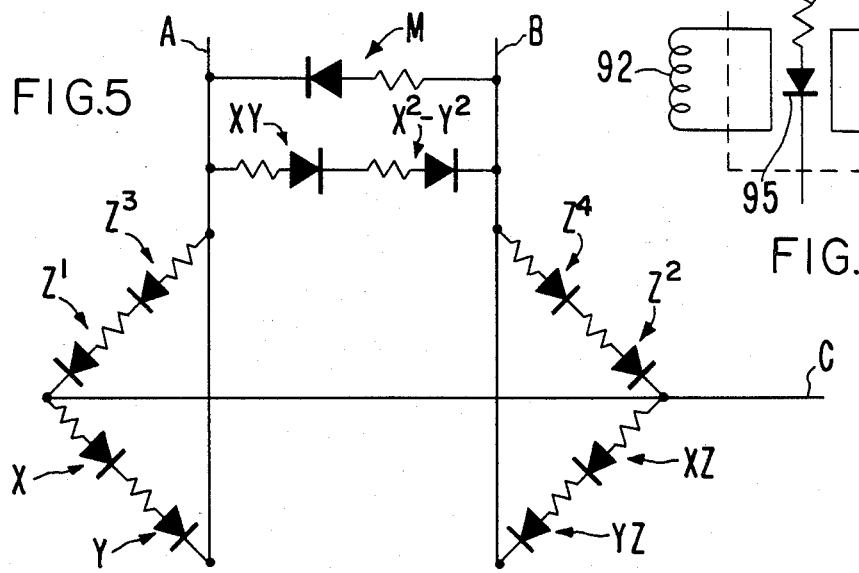
FIG. 5 shows still another diode matrix for selectable excitation of pairs of persistent switches.

The pairing of switches as selectable elements for the decoding array of FIG. 4 can also be accomplished by placing the paired switches in series with one another as shown in FIG. 5 and analyzed identically with Table III.

Figure 6:
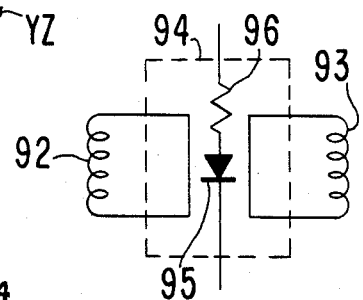
FIG. 6 shows a persistence switch for controlling a pair of superconducting coils.

Another embodiment for actuating a plurality of coils is achieved by forming a persistence switch which contains a plurality of superconducting shunts, each of which is associated with a corresponding coil. Such an arrangement is shown in FIG. 6 where coils 92 and 93 are controlled by a single persistence switch 94 which employs a single heat source comprising diode 95 and/or resistance 96.

Although the present discussion refers to a spectrometer, suggesting elimination of gradients, the invention is not so restricted. The achievement of any desired gradient or field shape also requires shimming coils to adjust the field distribution. Moreover, this description in terms of a superconducting magnet, while benefitting from increased thermal efficiency is not the exclusive context for the present invention.

Since many changes can be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. The method of achieving a desired magnetic field distribution from a plurality of magnetic field components produced by electrically excited coils wherein certain pairs of said coils interact through a mutual inductance thereof, comprising
   connecting a first coil of said pair to a first current regulated power supply,
   connecting a second coil of said pair to a second current regulated power supply, and
   adjusting either of said current regulated power supplies while maintaining said connections wherein said current regulated power supplies satisfy the effect of induced currents owing to said mutual inductance interaction.

2. Apparatus for selectively adjusting one of a plurality of interacting inductive elements, said inductive elements subject to a substantial mutual inductance therebetween, comprising
   A. first current regulated power supply means operatively associated with a first inductive element for excitation thereof;
   B. second current regulated power supply means operatively associated with the second inductive element for stabilizing the current flow thereof; and
   C. means for varying a parameter of at least first said current regulated power supply means, thereby to vary the current in the first inductive element associated therewith, the second said power supply means compensating induced current variations in the inductive element connected thereto.

3. The apparatus of claim 2 wherein said inductive elements are superconducting coils and said apparatus includes a cryostat for housing said elements.

4. The apparatus of claim 3 comprising a number N of superconducting persistence switches for relatively connecting each said inductive element to said operatively associated power supply means, a number K of conductors for communicating from the exterior of said cryostat to the interior thereof for the activation of said switches, and decoding circuit means for producing selected combinations of at least N distinguishable output signals from K input signals where N less than K.

5. Apparatus for controlling a first plurality of persistent superconducting circuits concurrently from a single activating signal comprising a first plurality of superconducting shunts each operatively associated with each said superconducting circuit, a single heat source activated by said activating signal said plurality of shunts in thermal communication with said heat source.

* * * * *